United States Patent [19]

Pope

[11] 4,131,179

[45] Dec. 26, 1978

[54] HIGH FIDELITY SPEAKER SYSTEM

[76] Inventor: Darrel L. Pope, 1918 Jacqueline Dr., Denton, Tex. 76201

[21] Appl. No.: 751,898

[22] Filed: Dec. 17, 1976

[51] Int. Cl.² .......................... H05K 5/00; G10K 13/00

[52] U.S. Cl. .......................... 181/156; 181/148; 181/160

[58] Field of Search .......................... 181/144, 148–156, 181/160

[56] References Cited

U.S. PATENT DOCUMENTS

| | | | |
|---|---|---|---|
| 1,985,881 | 1/1935 | Buckley | 181/156 |
| 2,900,040 | 8/1959 | Novak | 181/152 |
| 2,917,127 | 12/1959 | Elliott | 181/151 |
| 3,089,562 | 5/1963 | Morgillo | 181/156 |
| 3,326,321 | 6/1967 | Valuch | 181/144 |
| 3,938,617 | 2/1976 | Forbes | 181/148 |

*Primary Examiner*—Stephen J. Tomsky
*Attorney, Agent, or Firm*—Hubbard, Thurman, Turner, Tucker & Glaser

[57] ABSTRACT

A speaker system comprised of an enclosure with a partition inside. The partition, set apart from a wall of the enclosure, has an aperture in it. A loudspeaker, mounted at the wall, has a speaker cone projecting into the aperture in the partition.

5 Claims, 2 Drawing Figures

HIGH FIDELITY SPEAKER SYSTEM

BACKGROUND OF THE INVENTION

This invention relates to a high fidelity loudspeaker system and, in particular, to an improved vented enclosure system.

In order to obtain substantial low frequency sound from a high fidelity loudspeaker, a baffle must be used with the speaker. This is normally accomplished by mounting the speaker in a wall of an enclosure, that is, a box or cabinet. In some designs the enclosure is sealed; in others, there is a vent opening in the enclosure. Some of the enclosures are vented through a duct; these are variously called ducted port, tuned port or tube vented systems.

Most loudspeaker enclosures have an internal volume of a few cubic feet or less. At such a size, air enclosed in the box represents a significant load on the moving element of the low frequency driver, ordinarily a dynamic loudspeaker with a moving cone. This load has considerable effect on the net motion of the speaker cone. The load takes various forms, according to the particular enclosure design employed, but one effect common to the several conventional designs is that produced by air turbulence. The effect of the moving speaker cone is to produce a motion of the air inside the enclosure that is characterized by a significant amount of turbulence. The turbulence of the air introduces a random component into the motion of the loudspeaker cone, giving rise to distortions in the sound produced by the system. The loudspeaker system of the present invention represents a solution to the distortion problem created by this turbulence.

SUMMARY OF THE INVENTION

In accordance with the present invention, there is provided an improved loudspeaker system of the type wherein a loudspeaker is mounted in an enclosure having a vent opening. The loudspeaker has a moving element for imparting vibrations to surrounding air, and the motion of this element produces a flow of air in the enclosure to and from the vent opening. The improvement in the system comprises means for directing the flow of air onto the moving element of the loudspeaker.

More particularly, there is provided a loudspeaker system including an enclosure, with a wall having a speaker opening and a vent opening. A loudspeaker having a speaker cone is mounted at the speaker opening. There is a partition spaced close to the wall, for separating a region of the enclosure from said openings and for forming a duct to the vent opening. There is an aperture in the partition, somewhat exceeding the size of the speaker opening and positioned opposite the speaker opening with the speaker cone projecting through the aperture.

In the system of the invention, motion of the speaker cone produces a flow of air between the vent opening and the separated region of the enclosure. The air flows through the duct and the aperture, and in flowing through the aperture is directed onto the speaker cone. Because the loudspeaker is in the path of the vent air flow, the speaker cone does not experience air turbulence occurring elsewhere in the enclosure. This is because of the smooth air stream flowing around the speaker cone into and from the duct. The smooth air flow, exerting a continuous pressure smoothly distributed on the cone, isolates the speaker cone from turbulence in the enclosure. The result is a speaker system with extended bass response as a result of the ducted vent design, but with reduced intrusion of distortion produced by air turbulence.

DESCRIPTION OF THE PREFERRED EMBODIMENT

Figure 1:
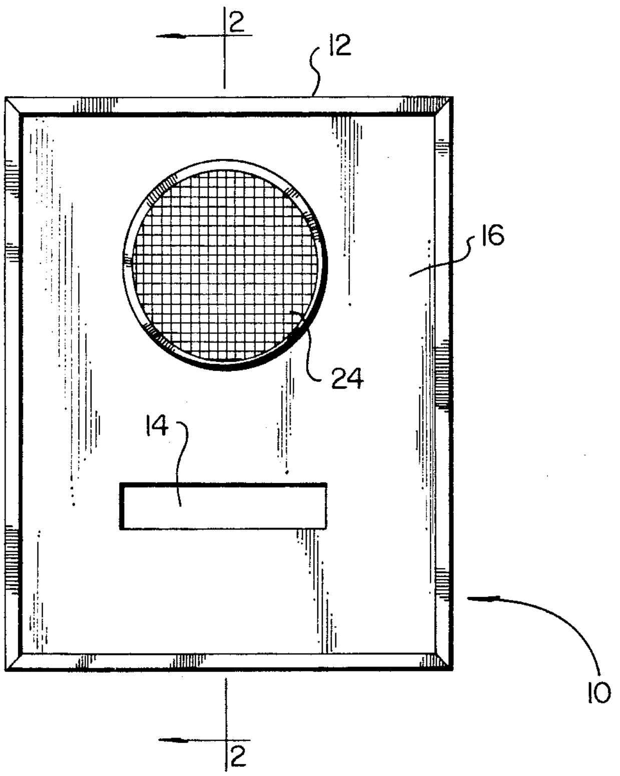
FIG. 1 is a front elevation of a speaker system according to the invention.

In the drawing there is seen a loudspeaker system according to the invention, indicated generally by the reference numeral 10. The system includes a six-sided box or enclosure 12 having a vent opening 14 in a wall 16 thereof. A loudspeaker 18, capable of low audio frequency vibration, is mounted at a speaker hole 20 in wall 16. The loudspeaker 18 shown is of the electrodynamic type, with a speaker cone 22 oriented to radiate outwards from the enclosure 12 in a conventional manner. The metal frame or basket which is a conventional feature of such loudspeakers is, for the most part, not shown in the drawing. An acoustically transparent grill 24 covers the speaker opening 20 to protect the mechanism of loudspeaker 18 from externally inflicted damage.

A partition 26, parallel to wall 16 and extending the full height and width of enclosure 12 divides the space within the enclosure into a major region 28 and a duct 30. Region 28 is preferably lined with sound absorbing material to decrease resonances. The partition 26 has a circular aperture 32 opposite speaker opening 20 and concentric with speaker cone 22, which projects into the aperture.

Loudspeaker system 10 operates as a system vented through a duct. When an audio signal is applied to loudspeaker 18, the moving element of the speaker, cone 22 produces sound waves in the air outside the enclosure 12. In addition, it applies a vibratory driving force to the air within enclosure 12, mainly to that in region 28. As the motion of speaker cone 22 moves it further into enclosure 12, air flows from region 28, through aperture 32 and duct 30, and out vent opening 14. Conversely, as cone 22 moves in the direction outward from enclosure 12, air is drawn into vent opening 14, through duct 30 and aperture 32, into region 28.

The moving air in duct 30 represents a portion of the mechanical load on loudspeaker 18. This portion of the load is tuned by varying the dimensions of duct 30, to provide an appropriate frequency response for system 10, with a response extended below the resonance of speaker 18. Parameters included in such tuning are the size of vent opening 14, the location of the opening on wall 16, and the distance that partition 26 is set apart from wall 16. Fiberglass acoustical material may be inserted in the duct for further tuning. These parameters are adjusted to accord with the characteristics of the speaker 18 as well as the size of enclosure 12, using conventional theoretical and empirical methods. In tests of the present invention, good results have been obtained using a separation of 0.5–0.75 inch between wall 16 and partition 26. Thus, the duct 30 occupies a small portion of the total volume enclosed with enclosure 12. If the enclosure measures one foot from back to front, the 0.5–0.75 inch duct constitutes less than 10 percent of the total volume.

As the speaker cone 22 moves in and out driving the air in enclosure 12, it produces significant turbulence in region 28. In an ordinary vented speaker system, such turbulence would affect the displacement of the speaker cone in a random way, distorting the sound produced by the system. In speaker system 10, however, the air flowing back and forth between duct 30 and region 28 applies to speaker cone 22 a pressure that is not a random one, in space or time. The pressure accompanying the duct flow is smoothly distributed over the surface of cone 22 and varies with time in a manner dictated by the electrical signal driving loudspeaker 18. It is believed that the low distortion exhibited by the system 10 results from the presence of such a pressure on speaker cone 22, serving to protect the cone from the turbulences in region 28. Since the flow pressure on cone 22 is in opposition to the motion of the cone, and of a magnitude dictated by that motion, this pressure may also be thought of as a form of mechanical feedback which tends to stabilize the motion of the cone.

The aperture 32 may have a variety of shapes, such as square or hexagonal. It appears, however, that a more uniform air flow on cone 22 results from the use of a round aperture 32. Satisfactory results are obtained if the circular aperture 32 has a diameter about two inches greater than the diameter of the speaker 18, for speakers with diameters in the range of 5 to 12 inches. This result is obtained for the separation of 0.5–0.75 inch between wall 16 and partition 26, as described above.

The positions of the speaker hole 20 and vent hole 14 may be varied considerably. These variations can include having speaker hole 20 near the center of wall 16, with vent holes 14 above and below speaker 18.

Figure 2:
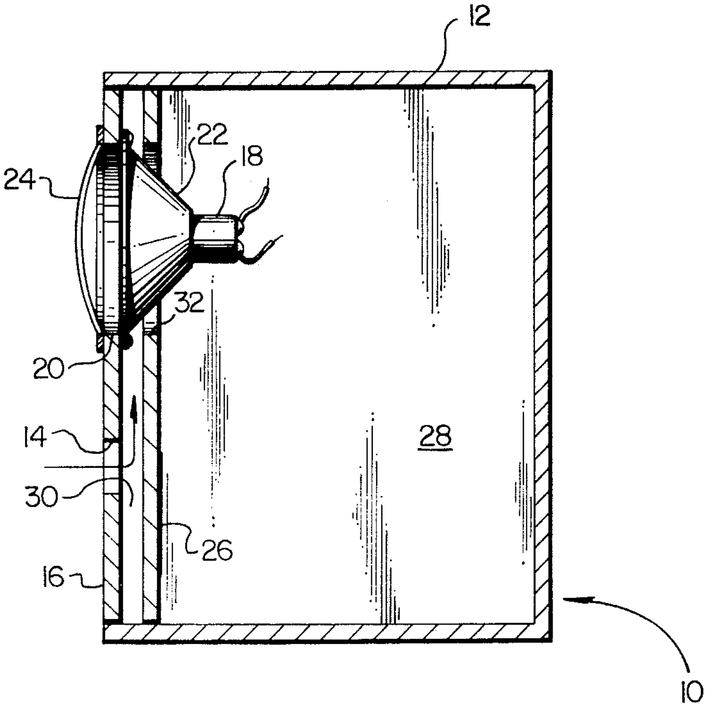
FIG. 2 is a cross-section taken on line 2—2 of FIG. 1.

More complex means than the aperture 32 may be envisioned for directing the duct flow onto cone 22. For example, partition 26 can include flow directing surfaces built up around the cone 22, possibly including multiple apertures interconnecting region 28 and duct 30. Such a configuration may be particularly important where loudspeaker cone 22 is more nearly a flat piston than shown in FIG. 2, thereby projecting only slightly into the enclosure 12.

Although preferred embodiments of the invention have been described in detail, it is to be understood that changes, substitutions, and alterations can be made therein without departing from the spirit and scope of the invention as defined by the appended claims.

What is claimed is:

1. A loudspeaker system comprising:
an enclosure, including a vent opening and a wall having a speaker opening;
a loudspeaker mounted at the speaker opening and having a speaker cone for generating air flow outside and inside the enclosure; and
means, including a partition with an aperture to receive the speaker cone therethrough, with edges of the aperture relatively closely spaced about the cone, for defining a first region away from said openings, and a second region adjoining the openings, said second region forming a duct between said aperture and said vent opening.

2. A loudspeaker system comprising:
an enclosure, including a wall having a speaker opening and a vent opening;
a loudspeaker having a speaker cone projecting into the enclosure from the speaker opening;
a partition in the enclosure, spaced from the vent opening a distance less than the projection of said cone into the enclosure and having an aperture to receive the speaker cone, with a relatively small distance between edges of the aperture and the speaker cone.

3. A loudspeaker system comprising:
an enclosure, including a vent opening and a wall with a speaker opening;
a partition dividing the space within the enclosure, and defining a region adjoining said openings, said partition having an aperture therein; and
a loud speaker mounted at the wall and having a cone projecting into the aperture in relatively closely spaced relationship to the aperture.

4. The system of claim 3,
wherein the loudspeaker cone has circular cross sections, and the longest linear dimension of said aperture is about two inches greater than the largest diameter of one of the cross sections; and
wherein the volume of said defined region is less than 10 percent of said enclosure space.

5. A loudspeaker system comprising:
an enclosure, having a speaker opening and a vent opening;
a loudspeaker mounted at the speaker opening and having a speaker cone to impart vibrations to surrounding air;
means, including a partition, for forming at least two regions in the enclosure, one region communicating with said vent and speaker openings, and the other region occupying most of the enclosure, said partition having means, including at least one aperture around the cone with edges of the aperture located relatively near the surface of the cone, for exposing the surface of the cone to vibrating air flowing from said other region to said vent opening.

* * * * *